United States Patent [19]

Higaki et al.

[11] Patent Number: 5,426,340
[45] Date of Patent: Jun. 20, 1995

[54] SURFACE ACOUSTIC WAVE DEVICE AND METHOD OF MANUFACTURING THE SAME

[75] Inventors: Kenjiro Higaki; Hideaki Nakahata; Akihiro Hachigo; Shinichi Shikata, all of Hyogo, Japan

[73] Assignee: Sumitomo Electric Industries, Ltd., Osaka, Japan

[21] Appl. No.: 188,536

[22] Filed: Jan. 27, 1994

[30] Foreign Application Priority Data

Jan. 29, 1993 [JP] Japan ................. 5-013006

[51] Int. Cl.$^6$ ............................................. H01L 41/08
[52] U.S. Cl. .................................................. 310/313 R
[58] Field of Search ........................ 310/313 R, 313 A

[56] References Cited

U.S. PATENT DOCUMENTS

| | | | |
|---|---|---|---|
| 4,354,130 | 10/1982 | Ono et al. | 310/313 A |
| 4,952,832 | 8/1990 | Imai et al. | 310/313 A |
| 5,086,549 | 2/1992 | Gualtieri | 29/25.35 |
| 5,160,869 | 11/1992 | Nakahata et al. | 310/313 A |
| 5,172,024 | 12/1992 | Broussoux et al. | 310/323 |
| 5,235,233 | 8/1993 | Yamamoto | 310/313 A |
| 5,270,298 | 12/1993 | Ramesh | 505/1 |
| 5,294,858 | 3/1994 | Nakahata et al. | 310/313 A |

FOREIGN PATENT DOCUMENTS

| | | | |
|---|---|---|---|
| 14132309 | 4/1993 | Germany | 310/313 A |
| 50-154088 | 12/1975 | Japan | H04R 17/00 |
| 58-91100 | 5/1983 | Japan | C30B 29/04 |
| 58-110494 | 7/1983 | Japan | C30B 29/04 |
| 58-135117 | 8/1983 | Japan | C01B 31/06 |
| 1-20714 | 1/1989 | Japan | H03H 9/145 |
| 1-62911 | 3/1989 | Japan | H03H 9/25 |
| 3-198412 | 8/1991 | Japan | H03H 9/145 |
| 14132920 | 5/1992 | Japan | 310/313 R |
| 15090874 | 4/1993 | Japan | 310/313 A |

OTHER PUBLICATIONS

Study on High Frequency SAW Filter of (ZnO/-Diamond/Si) Structure pp. 271+272 (English synopsis enclosed) Nakahata et al.

High frequency bandpass filter using polycrystalline diamond by Shikata et al. Diamond and Related Materials 1993 pp. 1197 to 1202.

"Diamond-Like Carbon Thin Films" by Akio Hiraki and Hiroshi Kawarada, Faculty of Engineering, Osaka University, Japan; pp. 41–49.

Primary Examiner—Thomas M. Dougherty
Attorney, Agent, or Firm—W. G. Fasse; W. F. Fasse

[57] ABSTRACT

A surface acoustic wave device includes a hard layer comprising diamond or a diamond-like carbon film, and a piezoelectric layer formed on the hard layer. It further includes a paired interdigital transducer and grounding electrode, which perform an electro-mechanical conversion, with the piezoelectric layer arranged therebetween. Then, the feature of the present invention is to form the grounding electrode of a conductive oxide. It is preferred that the conductive oxide is formed by doping an impurity into a piezoelectric material of ZnO. Therefore, the adhesion between the piezoelectric layer and the hard layer, and the grounding electrodes is increased, so that the device yield is enhanced, and a high electromechanical coupling coefficient can be achieved in a high frequency range.

27 Claims, 5 Drawing Sheets

5,426,340

SURFACE ACOUSTIC WAVE DEVICE AND METHOD OF MANUFACTURING THE SAME

CROSS-REFERENCE TO RELATED APPLICATION

This application is related to our copending application U.S. Ser. No. 08/118,976, filed on Sep. 9, 1993.

BACKGROUND OF THE INVENTION

1. Field of the Invention

The present invention relates to a surface acoustic wave device which operates in a high-frequency range including several hundreds of MHz to GHz and more particularly to such a surface acoustic wave device which comprises diamond or a diamond-like carbon film, and to a piezoelectric body, and also relates to a method for manufacturing the same.

2. Related Background Art

A surface acoustic wave device is an electromechanical conversion device utilizing a surface wave propagating on the surface of an elastic body and has the basic structure shown in FIG. 1. In a surface acoustic wave device 40, the piezoelectric phenomenon of a piezoelectric body 44 is used in exciting a surface acoustic wave. When an electrical signal is applied to one interdigital transducer (comb-like electrode) 43 formed on the piezoelectric body 44, the piezoelectric body 44 is stressed, and this stress becomes a surface acoustic wave. Then, the surface acoustic wave propagates on the piezoelectric body 44 and is extracted as an electrical signal at another interdigital transducer 43'. The frequency characteristics of the surface acoustic wave device include a band passing characteristic with a center frequency $f_0$ defined by $f_0 = V/\lambda_0$, where V is a propagation velocity of the surface acoustic wave and $\lambda_0$ is a space between each of the electrodes of the interdigital transducer.

The surface acoustic wave device requires a small number of parts and can be miniaturized. In addition, signals can be easily coupled into and out of a surface acoustic wave propagation path. This device can be used in a variety of applications such as a filter, a delay line, an oscillator, a resonator, a convolver, or a correlator. In particular, the surface acoustic wave device has been used as an IF television filter. Such surface acoustic wave devices have also been tested as filters for VTRs and various communication apparatus such as car telephones, cellular phones and so on.

A typical conventional surface acoustic wave device has a structure in which interdigital transducers are formed on a crystalline piezoelectric body such as LiNbO$_3$ or LiTaO$_3$. Another surface acoustic wave device having a piezoelectric thin film of ZnO or the like sputtered on a base substrate of glass or the like has also been used.

It is, however, difficult to manufacture a device operating in a high-frequency (GHz band) range using the conventional device structure described above. A device in which interdigital transducers are simply formed on a single crystalline piezoelectric body without any other consideration cannot have a high center frequency in excess of 1 GHz because its surface acoustic wave propagation velocity V is too low.

As indicated by the above equation, in order to achieve a surface acoustic wave device having band passing characteristics with a higher center frequency, the space $\lambda_0$ between each of the electrodes has to be smaller or the surface acoustic wave propagation velocity V has to be increased.

Decreasing the space $\lambda_0$ between each of the electrodes to increase the center frequency is limited by the capabilities of microlithography techniques such as photolithography.

For this reason, various techniques for increasing the propagation velocity V of the surface acoustic wave have been examined.

A device in which a sapphire layer having a larger propagation velocity than that of the piezoelectric body for the surface acoustic wave is placed between a base substrate and a piezoelectric layer is disclosed in Japanese Patent Laid-Open No. 50-154088(1975) corresponding to Japanese Koukoku (Opposition) Publication No. 54-38874(38874/1979). Further, a device in which a piezoelectric layer is deposited on a diamond layer in order to increase the propagation velocity of the surface acoustic wave is disclosed in Japanese Patent Laid-Open No. 64-62911 (62911/1989) by Imai et al. and Japanese Patent Laid-Open No. 3-198412 (198412/1991) by Nakahata et al. Present FIGS. 2 to 5 show the devices disclosed in these references.

In a device shown in FIG. 2, a piezoelectric layer 54 is formed on a diamond layer 52 and between these layer, interdigital transducers 53 are formed. In a device shown in FIG. 3, short circuiting electrodes 56 are placed on the piezoelectric layer 54 of the device shown in FIG. 2. In a device shown in FIG. 4, a piezoelectric layer 54 is formed on a diamond layer 52, and interdigital transducers 53 are placed on the piezoelectric layer 54. The device shown in FIG. 5 comprises the short circuiting electrodes 56 placed between the piezoelectric layer 54 and the diamond layer 52 of the device shown in FIG. 4.

As described above, it has been known that placing the short circuiting electrodes 56 between the piezoelectric layer 54 and the diamond layer 52 in the surface acoustic wave device having such a structure shown in FIG. 4 can achieve a higher electromechanical coupling coefficient.

However, it has been found that the yield is reduced if the surface acoustic wave device with such a structure is manufactured.

SUMMARY OF THE INVENTION

It is an object of the present invention to provide a surface acoustic wave device comprising such a structure but with an increased manufacturing yield, and to provide a method for manufacturing the same.

Further, it is another object of the present invention to provide a surface acoustic wave device having a high electromechanical coupling coefficient in a high-frequency range and a method of manufacturing the same.

Additional objects and advantages of the present invention will be apparent from the following description.

A surface acoustic wave device of the present invention comprises a hard layer comprising diamond as a composition component, a piezoelectric layer formed on the hard layer, a pair of grouped interdigital transducers (IDT) electrodes, spaced apart, for performing electro-mechanical conversion, and a grounding electrode comprising a conductive oxide, in a pattern or position corresponding to each of the electrodes. The IDT of electrodes and the grounding electrode is disposed with the piezoelectric layer therebetween, and either the IDT electrodes or the grounding electrode is disposed on the hard layer.

Thus, the grounding electrode is formed of a conductive oxide, so that crystalline turbulence in an interface between the grounding electrode and the hard layer or between the grounding electrode and the piezoelectric layer can be remarkably suppressed and the adhesive bonding between adjacent layers can be enhanced.

Further, in order to increase the propagation velocity of the surface acoustic wave, it is preferred that the hard layer comprises diamond or a diamond-like carbon film.

Further, in order to suppress the variation of device characteristics corresponding to a variation of temperature, especially a variation of propagation velocity of the surface acoustic wave, and also to protect a central part of the device from the external environment, it is preferred that a layer comprising silicon dioxide is formed on the piezoelectric layer.

Moreover, from the viewpoint of enhancing the adhesion between the piezoelectric layer and the grounding electrode, it is preferred that a conductive oxide forming the grounding electrode is formed by doping an impurity into the material constituting the piezoelectric body.

A method of manufacturing a surface acoustic wave device of the present invention comprises a step of forming a hard layer comprising diamond as a composition component on a base substrate, a step of forming a piezoelectric layer comprising a piezoelectric material, a step of forming a pair of grouped IDT electrodes, spaced apart, for performing electro-mechanical conversion, and a step of forming a grounding electrode comprising the conductive oxide.

Further, the method preferably comprises a step of forming a layer comprising silicon dioxide on both the piezoelectric layer and the IDT electrodes.

The present invention will become more fully understood from the detailed description given below and the accompanying drawings which are for purposes of illustration only, and thus are not to be considered as limiting the present invention.

The further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The general features of a surface acoustic wave device according to the present invention will be explained more particularly prior to explaining the example embodiments.

A diamond-like carbon film, which is a hard layer comprising diamond, is called i-carbon. Diamond-like carbon film was discovered during studies on deposition syntheses of diamond. The physical properties of the i-carbon have been examined and clarified by many researchers. Although there is no theory that defines the diamond-like carbon film as one distinct material, this film is apparently different from diamond or graphite and preferably has the following properties.

The diamond-like carbon film:
(1) is a composition consisting essentially of carbon and hydrogen and has a smaller number of hydrogen atoms than carbon atoms.
(2) is in an amorphous non-crystalline state.
(3) has a greater hardness than at least a general metal.
(4) is an electric insulator.
(5) transmits light therethrough.

Figure 8:
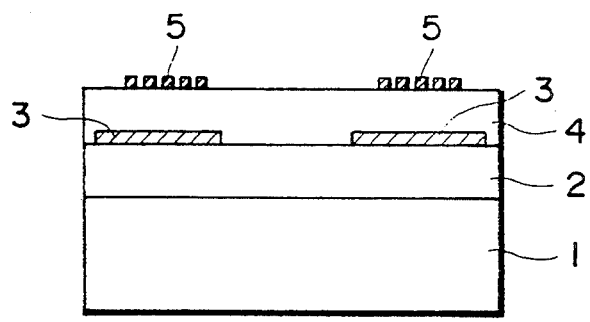
FIGS. 8 to 13 are sectional views showing different examples of the structure of a surface acoustic wave device according to the present invention.

Further, diamond-like carbon film having such a noncrystalline structure, crystalline diamond and graphite can be distinguished by Raman spectroscopic analysis as disclosed by Akio Hiraki et al.; "Diamond-Like Carbon Thin Films", TANSO No. 128 (1987) PP. 41-49, published by the carbon society of Japan, Tokyo. A typical Raman spectrum is shown in FIG. 8, p. 47 of the reference. The sharp spectrum is seen at 1332 cm$^{-1}$ for diamond and at 1580 cm$^{-1}$ for graphite, whereas the wide spectrum is seen at 1360 cm$^{-1}$ and 1600 cm$^{-1}$ for the diamond-like carbon film (noncrystalline structure).

It is preferred that diamond has a hardness of up to 10,000 (Hv), while the diamond-like carbon film has a hardness of 1,000 to 5,000 (Hv). It is noted that the hardness described herein is obtained by a Vickers Hardness test.

Further, a higher resistivity of diamond and the diamond-like carbon film is also suitable, but a resistivity of approximately $10^6$ $\Omega$cm–$10^8$ $\Omega$cm is preferred. It is noted that the resistivity described herein is obtained by a four probe method.

Similar to diamond synthesis, the diamond-like carbon film is manufactured by a deposition (e.g., vapor phase deposition) process such as plasma CVD, ion beam deposition, or sputtering, which is basically the same as the manufacturing process of the diamond thin layer described hereinafter.

According to the present invention, the hard layer may comprise a small amount of impurity. The hard layer comprising high purity diamond is preferably used from the viewpoint of a higher surface acoustic wave propagation velocity and a higher electro-mechanical conversion efficiency. That is, it is preferred that the hard layer comprises diamond as a composition component.

On the other hand, the diamond-like carbon film can be synthesized and deposited even at room temperature while diamond requires a synthesis temperature of 500° C. or higher. For this reason, the diamond-like carbon film makes it possible to widen the selection of a base posed with the piezoelectric layer therebetween, and either the IDT electrodes or the grounding electrode is disposed on the hard layer.

Thus, the grounding electrode is formed of a conductive oxide, so that crystalline turbulence in an interface between the grounding electrode and the hard layer or between the grounding electrode and the piezoelectric layer can be remarkably suppressed and the adhesive bonding between adjacent layers can be enhanced.

Further, in order to increase the propagation velocity of the surface acoustic wave, it is preferred that the hard layer comprises diamond or a diamond-like carbon film.

Further, in order to suppress the variation of device characteristics corresponding to a variation of temperature, especially a variation of propagation velocity of the surface acoustic wave, and also to protect a central part of the device from the external environment, it is preferred that a layer comprising silicon dioxide is formed on the piezoelectric layer.

Moreover, from the viewpoint of enhancing the adhesion between the piezoelectric layer and the grounding electrode, it is preferred that a conductive oxide forming the grounding electrode is formed by doping an impurity into the material constituting the piezoelectric body.

A method of manufacturing a surface acoustic wave device of the present invention comprises a step of forming a hard layer comprising diamond as a composition component on a base substrate, a step of forming a piezoelectric layer comprising a piezoelectric material, a step of forming a pair of grouped IDT electrodes, spaced apart, for performing electro-mechanical conversion, and a step of forming a grounding electrode comprising the conductive oxide.

Further, the method preferably comprises a step of forming a layer comprising silicon dioxide on both the piezoelectric layer and the IDT electrodes.

The present invention will become more fully understood from the detailed description given below and the accompanying drawings which are for purposes of illustration only, and thus are not to be considered as limiting the present invention.

The further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Figure 1:
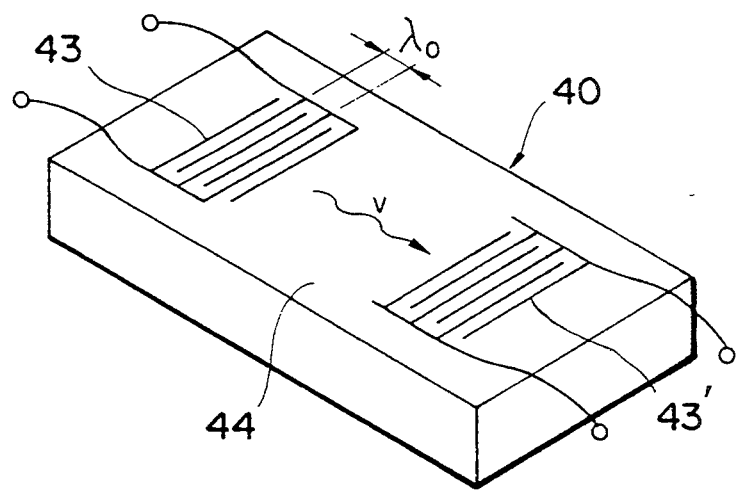
FIG. 1 is a perspective view illustrating the basic structure of a surface acoustic wave device.

FIG. 1 is a perspective view illustrating the basic structure of a surface acoustic wave device.

Figure 2:
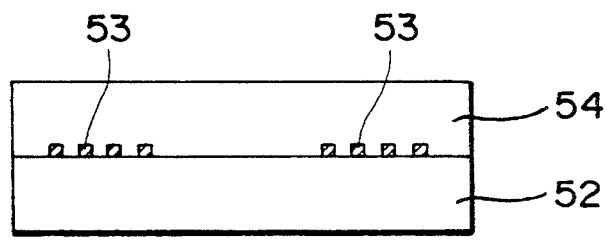
FIG. 2 is a sectional view showing an example of a prior art structure of a surface acoustic wave device.

FIG. 2 is a sectional view showing an example of a prior art structure of a surface acoustic wave device.

Figure 3:
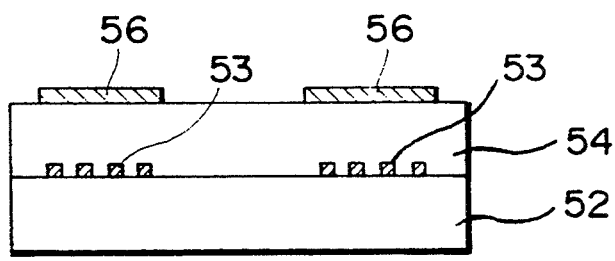
FIG. 3 is a sectional view showing an example of a prior art structure of a surface acoustic wave device.

FIG. 3 is a sectional view showing an example of a prior art structure of a surface acoustic wave device.

Figure 4:
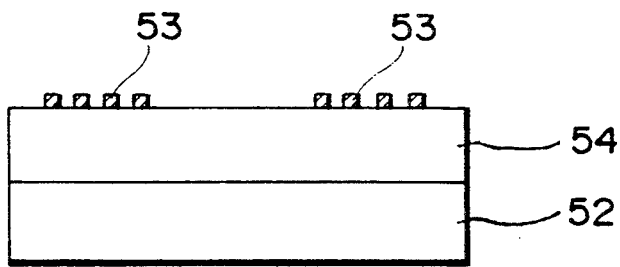
FIG. 4 is a sectional view showing an example of a prior art structure of a surface acoustic wave device.

FIG. 4 is a sectional view showing an example of a prior art structure of a surface acoustic wave device.

Figure 5:
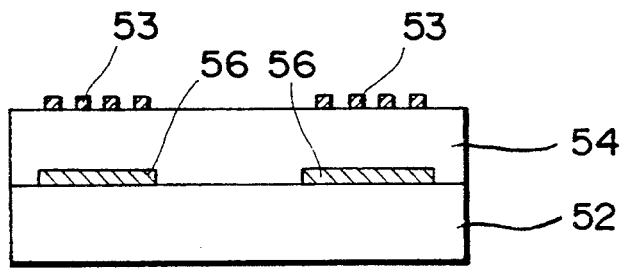
FIG. 5 is a sectional view showing an example of a prior art structure of a surface acoustic wave device.

FIG. 5 is a sectional view showing an example of a prior art structure of a surface acoustic wave device.

Figure 6:
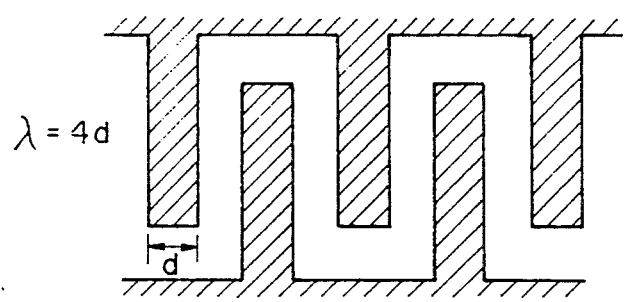
FIG. 6 is a plan view showing the configuration of an interdigital transducer.

FIG. 6 is a plan view showing the configuration of an interdigital transducer.

Figure 7:
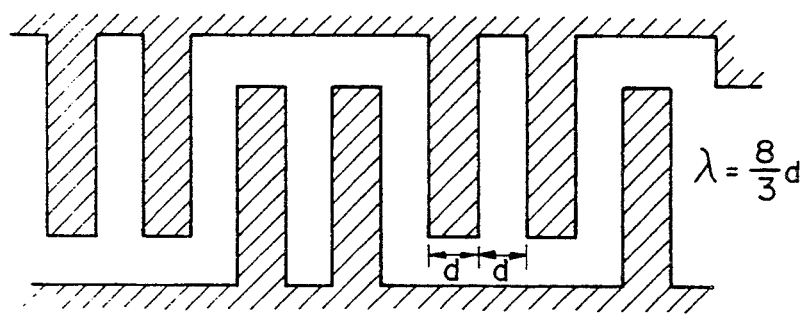
FIG. 7 is a plan view showing the configuration of an interdigital transducer.

FIG. 7 is a plan view showing the configuration of an interdigital transducer.

FIGS. 8 to 13 are sectional views showing different examples of the structure of a surface acoustic wave device according to the present invention.

DETAILED DESCRIPTION OF THE PREFERRED EMBODIMENTS

The general features of a surface acoustic wave device according to the present invention will be explained more particularly prior to explaining the example embodiments.

A diamond-like carbon film, which is a hard layer comprising diamond, is called i-carbon. Diamond-like carbon film was discovered during studies on deposition syntheses of diamond. The physical properties of the i-carbon have been examined and clarified by many researchers. Although there is no theory that defines the diamond-like carbon film as one distinct material, this film is apparently different from diamond or graphite and preferably has the following properties.

The diamond-like carbon film:
(1) is a composition consisting essentially of carbon and hydrogen and has a smaller number of hydrogen atoms than carbon atoms.
(2) is in an amorphous non-crystalline state.
(3) has a greater hardness than at least a general metal.
(4) is an electric insulator.
(5) transmits light therethrough.

Further, diamond-like carbon film having such a noncrystalline structure, crystalline diamond and graphite can be distinguished by Raman spectroscopic analysis as disclosed by Akio Hiraki et al.; "Diamond-Like Carbon Thin Films", TANSO No. 128 (1987) PP. 41–49, published by the carbon society of Japan, Tokyo. A typical Raman spectrum is shown in FIG. 8, p. 47 of the reference. The sharp spectrum is seen at 1332 cm$^{-1}$ for diamond and at 1580 cm$^{-1}$ for graphite, whereas the wide spectrum is seen at 1360 cm$^{-1}$ and 1600 cm$^{-1}$ for the diamond-like carbon film (noncrystalline structure).

It is preferred that diamond has a hardness of up to 10,000 (Hv), while the diamond-like carbon film has a hardness of 1,000 to 5,000 (Hv). It is noted that the hardness described herein is obtained by a Vickers Hardness test.

Further, a higher resistivity of diamond and the diamond-like carbon film is also suitable, but a resistivity of approximately $10^6$ $\Omega$cm–$10^8$ $\Omega$cm is preferred. It is noted that the resistivity described herein is obtained by a four probe method.

Similar to diamond synthesis, the diamond-like carbon film is manufactured by a deposition (e.g., vapor phase deposition) process such as plasma CVD, ion beam deposition, or sputtering, which is basically the same as the manufacturing process of the diamond thin layer described hereinafter.

According to the present invention, the hard layer may comprise a small amount of impurity. The hard layer comprising high purity diamond is preferably used from the viewpoint of a higher surface acoustic wave propagation velocity and a higher electro-mechanical conversion efficiency. That is, it is preferred that the hard layer comprises diamond as a composition component.

On the other hand, the diamond-like carbon film can be synthesized and deposited even at room temperature while diamond requires a synthesis temperature of 500° C. or higher. For this reason, the diamond-like carbon film makes it possible to widen the selection of a base substrate on which the hard material, e.g. the diamond-like carbon film is to be formed. A diamond-like carbon film having a large area can be easily formed and has a flatter surface compared to diamond.

According to the present invention, the hard layer may consist of natural single crystalline diamond or single crystalline diamond synthesized at a very high pressure. Alternatively, the hard layer may be a layer of diamond thin film formed on a base substrate or a diamond-like carbon film.

In order to increase the propagation velocity of the surface acoustic wave, the thickness of the hard layer is preferably in excess of 0.4 times the wavelength of the propagating surface acoustic waves and more preferably in excess of 0.6 times that wave length. The base substrate on which the diamond thin film is to be formed is not limited to a specific one, but preferably comprises semiconductor material or an inorganic material such as Si, Mo, Cu, Ni, W, GaAs, or $LiNbO_3$.

The base substrate on which the diamond-like carbon film is to be formed can be selected from a wider range of materials than can the substrate for diamond. Such a base substrate can comprise an organic compound such as a synthetic resin.

The diamond thin film formed on the base substrate may be single crystalline or polycrystalline diamond. The diamond thin film formed by vapor phase deposition synthesis generally has a polycrystalline structure.

It is preferred that the method of forming the diamond thin film on the base substrate is a CVD method such as a thermal CVD method, a plasma CVD method, a microwave CVD method, a photo-CVD method, or a laser CVD method, sputtering or ion beam deposition. The diamond-like carbon film may be formed on a base substrate by the same forming method as described above regarding the diamond thin film. These methods of forming a diamond thin film are disclosed in Japanese patent Laid-Open No. 58-91100 (91100/1983), No. 58-135117 (135117/1983) and No. 58-110494 (110494/1983).

Several methods of decomposing and exciting a source gas to grow a diamond thin film is enumerated as follows:

(1) heating a thermoelectron radiant material to a temperature of 1,500K or more to activate a source gas;
(2) using a discharge generated by a DC, AC, or microwave electric field;
(3) using ion bombardment;
(4) using an irradiating light such as a laser beam; and
(5) causing combustion of a source gas.

A source material used to synthesize a diamond thin film or a diamond-like carbon film is generally a carbon-containing compound and preferably used in combination with hydrogen gas. An oxygen-containing compound and/or an inert gas may be added to the source gas, as needed.

The preferred examples of the carbon-containing compound are a paraffin-based hydrocarbon (e.g., methane, ethane, propane, or butane), an olefin-based hydrocarbon (e.g., ethylene, propylene, or butylene), an acetylene-based hydrocarbon (e.g., acetylene or allylene), a diolefin-based hydrocarbon (e.g., butadiene), an alicyclic hydrocarbon (e.g., cyclopropane, cyclobutane, cyclopentane, or cyclohexane), an aromatic hydrocarbon (e.g., cyclobutadiene, benzene, toluene, or cyclohexane), ketones (e.g., acetone, diethyl ketone, and benzophenone), alcohols (e.g., methanol and ethanol), amines (trimethylamine and triethylamine), carbon dioxide gas, and carbon monoxide. These materials can be used singly or in a combination of at least two materials. Alternatively, the carbon-containing compound may be a material consisting essentially of only carbon atoms, such as graphite, coal, or coke.

As the oxygen-containing compound added to the source gas, water, carbon monoxide, carbon dioxide, or hydrogen peroxide is preferable because each of these is very available and accessible.

The preferred examples of the inert gas which can be added to the source gas are argon, helium, neon, krypton, xenon, and radon.

The hard layer may be constituted by a base substrate consisting essentially of single crystalline diamond. The single crystalline diamond base substrate is preferably used to increase the surface acoustic wave propagation velocity and the electro-mechanical coupling coefficient. It is preferred that such a base substrate comprises natural diamond or synthetic diamond synthesized at a very high pressure.

According to the present invention, it is preferred that the piezoelectric layer comprises a piezoelectric material such as ZnO, AlN, $Pb(Zr,Ti)O_3$, $(Pb,La)(Zr,Ti)O_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe, or CdS.

The piezoelectric layer may comprise either a single crystalline or polycrystalline piezoelectric material but in order to use a device in a higher-frequency range, the piezoelectric layer preferably comprises a single crystalline material in which a surface acoustic wave is scattered less that in a polycrystalline material. A layer comprising a piezoelectric material such as ZnO, AlN, or $PB(Zr,Ti)O_3$ is preferably formed by a CVD method or sputtering.

According to the present invention, a pair of ground electrodes which perform the electro-mechanical conversion, i.e., conversion between an electrical signal and a surface acoustic wave, is typically a comb-like electrode or an electrode group typically called an interdigital transducer (IDT).

For example, the interdigital transducer being used has the configuration as shown in FIG. 6 and FIG. 7.

The interdigital transducer can be manufactured to have an electrode spacing of about 1.2 $\mu m$ using the photolithographic technique. A material for forming the electrode is preferably a metal having a low resistivity and for example, a metal such as Au, Ag, and Al which can be deposited at a low temperature, and a refractory metal such as Ti, W, and Mo are preferably used. Al and Ti are preferably used to facilitate formation of electrodes. W and Mo are preferably used to improve adhesion properties with diamond. The interdigital transducer may be formed of a single metal material or a combination of two or more metal materials such that Al is deposited on Ti.

The process of forming the interdigital transducer will be explained below. First, a metal layer selectively comprising the above materials is formed at a predetermined location. Next, a resist film is formed on the metal layer and thereafter a mask having a interdigital transducer pattern formed on a transparent flat plate of glass is placed above the resist film, and the resist film is exposed with a mercury lamp. Thereafter, the exposed resist film is developed to obtain a resist pattern alternatively. The resist pattern may be formed by directly exposing a resist film with an electron beam instead of by the above-mentioned method.

After the resist pattern is formed, the metal layer is patterned into a predetermined shape by etching. To etch a layer comprising a metal having a low melting point such as Al, an alkaline solution such as a sodium hydroxide solution or an acidic solution such as a nitric acid solution is used. On the other hand, to etch a refractory metal, a solution mixture of hydrofluoric acid and nitric acid is used. Reactive ion etching using a gas such as $BCl_3$ may be used to etch the metal layer.

According to the present invention, a pair of the grouped electrodes may also be formed of diamond (semiconductor diamond) having electrical conductivity. It is preferred that the conductive diamond is formed by a method of epitaxially growing diamond while doping with an impurity such as P, Al, P, or S, a method of doping such an impurity into insulating diamond by ion implantation, a method of radiating insulating diamond with an electron beam to introduce lattice defects, or a method of hydrogenating insulating diamond.

The preferred configuration of a surface acoustic wave device according to the present invention is shown in FIG. 8-FIG. 13.

A surface acoustic wave device shown in FIG. 8 comprises a diamond thin film 2 as a hard layer formed on an Si base substrate 1, and a pair of grounding electrodes 3 spaced apart on the diamond thin film 2. Here, the grounding electrodes 3 are formed of an electrically conductive oxide. Then, a piezoelectric layer 4 is formed so that it covers the grounding electrodes 3 and the diamond thin film 2. Further, interdigital transducers 5 as a pair of grouped electrodes is formed in a position corresponding to each grounding electrode 3 on the piezoelectric layer 4. Here, as shown in FIG. 9, the locations or positions of the grounding electrodes 3 and the interdigital transducers 5 can be exchanged.

Figure 9:
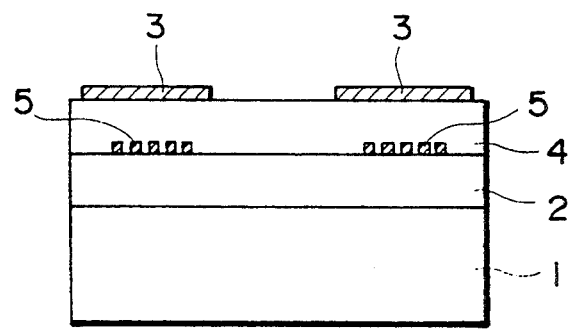
Figure 10:
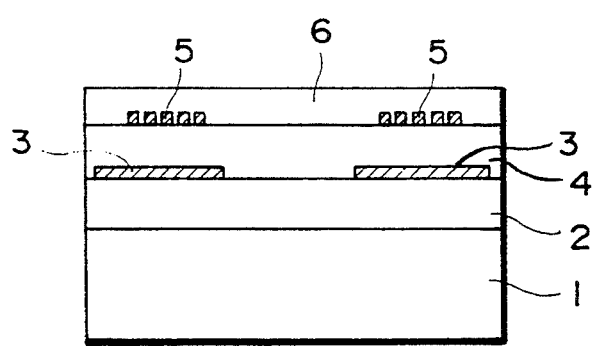
Figure 11:
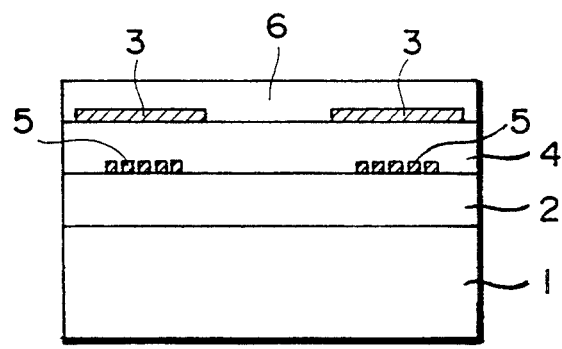
Figure 12:
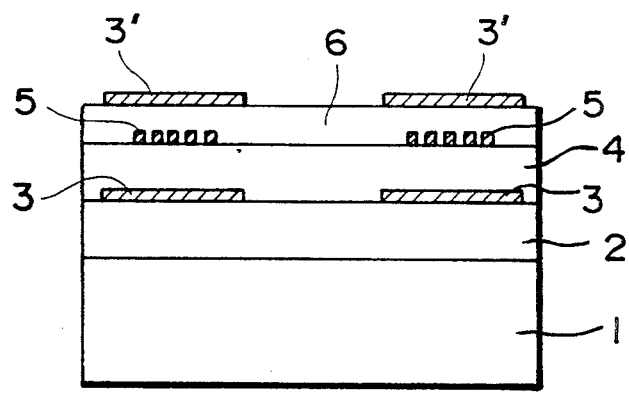
Figure 13:
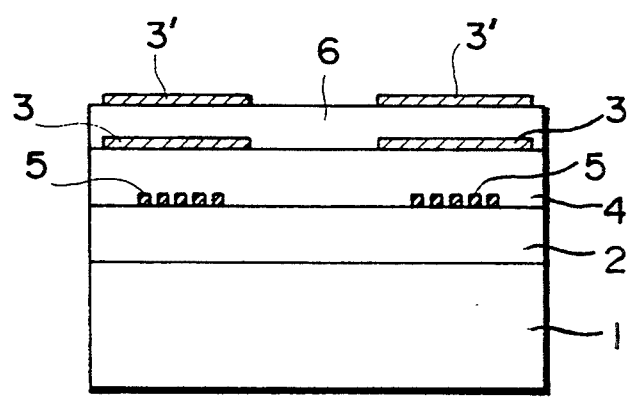

Further, as shown in FIG. 10 and FIG. 11, an $SiO_2$ film 6 may be formed on a top surface of the device shown in FIG. 8 and FIG. 9. Moreover, as shown in FIG. 12 and FIG. 13, grounding electrodes 3' may be formed on the $SiO_2$ film 6 of the device shown in FIG. 10 and FIG. 11. It is noted that inventors of the present invention have applied for patent regarding the invention relating to placing the $SiO_2$ film on the surface acoustic wave device (U.S. patent application Ser. No. 08/118,976).

In the aforesaid configuration, the grounding electrodes 3 of an electrically conductive oxide are sandwiched either between the diamond thin film 2 as a hard layer and the piezoelectric layer 4 or between the piezoelectric layer 4 and the $SiO_2$ film 6, so that electromechanical coupling is enhanced.

Further, the piezoelectric layer and the grounding electrodes may be formed of different materials, or and they may be formed of basically the same material.

However, when the piezoelectric layer and the grounding electrodes are formed of the same material, the adhesion at the interface between the piezoelectric layer and the grounding electrodes in the surface acoustic wave device can be enhanced or improved more than when they are formed of different materials.

In the case wherein the piezoelectric layer and the grounding electrodes are formed of the same material, for example it is preferred that the piezoelectric layer is formed of some piezoelectric material and the grounding electrodes are formed of a material oxide having electrical conductivity formed by doping an impurity to the piezoelectric material. More particularly, the piezoelectric layer is formed of ZnO and the grounding electrodes are formed of ZnO having electrical conductivity by doping a metal element such as Al, V, Ga or In into this ZnO. Both ZnO having electrical conductivity and ZnO as a piezoelectric body have almost the same crystal structure and composition, and their adhesion is the highest.

On the other hand, in the case wherein the piezoelectric layer and the grounding electrodes are formed of different materials, for example, the grounding electrodes can be formed of a conductive oxide including metal oxide, such as $SnO_2$, $In_2O_3$, TiO, $LiV_2O_4$, $ReO_3$, $LaTiO_3$, $SrVO_3$, $CaCrO_3$, $V_2O_3$, $VO_2$, $CrO_2$ or $IrO_2$, which is a nonpiezoelectric material. Alternatively, the piezoelectric layer is formed of some piezoelectric material and the grounding electrodes can be formed of a piezoelectric material which has been made conductive by doping the piezoelectric material with an impurity other than the piezoelectric material used in the piezoelectric layer. More particularly, the piezoelectric layer can be formed of piezoelectric material such as AlN, $PB(Zr, Ti)O_3$, $LiTaO_3$ or $SiO_2$, and the grounding electrodes can be formed of ZnO that has been doped with a metal element such as Al, V, Ga or In.

In the case wherein the grounding electrodes are formed of piezoelectric material such as ZnO having electrical conductivity, sputtering is preferably employed, with a sintered body including a metal oxide such as $Al_2O_3$, $V_2O_3$, $Ga_2O_3$ or $In_2O_3$ as a target.

Further, in the case wherein the grounding electrode is formed of the electrically conductive oxide which is not a piezoelectric material, sputtering, an ion-plating method or an electron beam (EB) deposition method is preferably used.

The resistivity of the grounding electrode is preferably less than $10^{-2} \Omega cm$ and more preferably less than $10^{-3} \Omega cm$ in order to function sufficiently as a grounding electrode. The resistivity of the piezoelectric layer is preferably more than $10^5 \Omega cm$. It is noted that each resistivity is measured based on the four probe method.

For example, a layer comprising silicon dioxide ($SiO_2$) is preferably deposited by a sputtering method, an ion-plating method, a CVD method, an electron beam (EB) deposition method or a low temperature CVD method. Silicon dioxide ($SiO_2$) may be either crystal or noncrystal.

Here, the preferred thickness of each layer and each electrode is shown. The thickness of a hard layer is greater or equal to 1 $\mu m$, the thickness of a piezoelectric layer is 1000 angstroms to 5 $\mu m$, the thickness of a group of electrodes is 100 angstroms to 1000 angstroms, the thickness of a grounding electrode is 100 angstroms to 1 $\mu m$, and the thickness of a layer comprising dioxide is 1000 angstroms to 5 $\mu m$.

The adhesion between the grounding electrodes and the hard layer or between the grounding electrodes and the piezoelectric layer has been found to be sufficient even when stresses are applied to the grounding electrodes, so that detachment of the electrodes hardly ever occurs, unlike in the conventional devices. Therefore, excellent characteristics of the device can be achieved without any surface acoustic wave scattering or deterioration.

In addition, the structure of the device is resistant against variations of temperature during the manufacturing process, so that the yield of the device can be improved.

Thus, according to the present invention, a surface acoustic wave device is provided which can increase the device yield and which has a high electromechanical conversion efficiency in a high frequency range.

First Embodiment

An Si base substrate having dimensions of 10×10×1 mm was prepared and placed in a plasma CVD apparatus. The reaction chamber of the apparatus was evacuated, and a gas mixture of $H_2$: $CH_4=200:1$ was introduced therein. Plasma CVD was performed under the following conditions: a vacuum chamber pressure of about 40 Torr, a base substrate temperature of 850° C., and a microwave power of 400 W to grow a 30 μm thick diamond thin film (hard layer) on the Si base substrate. The diamond thin film was left in the atmosphere of the reaction chamber at 450° C. for 10 minutes to increase the resistivity of the diamond thin film.

Next, a surface of the diamond thin film was machine polished using an electro-deposited diamond grindstone, and thereafter magnetron-sputtered using as a target a ZnO polycrystalline body including alumina ($Al_2O_3$). At this time, sputtering was performed in a mixture gas of Ar: $O_2=1:1$ at a 150 W sputtering output and a 200° C. base substrate temperature. Therefore, a conductive ZnO thin film to which 2.0 atomic % Al into ZnO was doped was deposited to 500 angstroms thickness. At this time, the resistivity of the deposited conductive ZnO thin film was less than or equal to $1.0\times10^{-3}\Omega cm$.

Further, under the same conditions, magnetron sputtering was applied to the deposited conductive ZnO thin film using a target of polycrystalline ZnO including $Li_2CO_3$. Therefore, an insulating ZnO thin film into which 2.0 atomic % Li to ZnO was doped was deposited to 5.0 μm thickness.

Next, a 500 angstroms thick layer comprising Al was vapor-deposited on the insulating ZnO thin film by a resistance heating method. Next, interdigital transducers (a group of electrodes) having a 2 μm space between each of the electrodes were formed on the Al layer by using a photolithography method. The interdigital transducer shape is as shown in FIG. 6.

FIG. 8 is a sectional view showing a surface acoustic wave device based on the first embodiment having a structure as described above.

As shown in FIG. 8, a diamond thin film 2 is formed on an Si base substrate 1 and grounding electrodes 3 comprising conductive ZnO are formed on the diamond thin film 2, and a piezoelectric layer 4 comprising insulating ZnO is formed thereon to cover the electrodes 3 and the remaining surface of the diamond thin film 2. Further, interdigital transducers 5 are formed on the piezoelectric layer 4.

First Comparative Example

In a first comparative example, to be compared with the above surface acoustic wave device, a comparative surface acoustic wave device was manufactured following the same procedures as described above for the first embodiment, except that 500 angstroms thick grounding electrodes comprising metal Al were formed by a vacuum vapor deposition method.

For the surface acoustic wave device of the first comparative example, a diamond thin film is formed on an Si base substrate, and grounding electrodes comprising Al are formed on the diamond thin film, and further a piezoelectric layer comprising insulating ZnO is formed thereon. Moreover, interdigital transducers are formed on the piezoelectric layer.

Ten surface acoustic wave devices were manufactured for each of the first embodiment and the first comparative example. Immediately after manufacturing, the occurrence of detachment and the first order mode electromechanical coupling coefficient $K^2$ of each sample were evaluated. Evaluation of the occurrence of detachment was performed using a 200× optical microscope. Further, the electromechanical coupling coefficient $K^2$ was calculated from the following equation based on a Smith equivalent circuit.

$K^2=\frac{1}{8}\cdot G\cdot f_0 C\cdot N$ (G, $f_0$ and C are measured.)

where G: radial conductance of an interdigital transducer $f_0$: central frequency C: capacitance of an interdigital transducer N: the number of pairs of electrodes in an interdigital transducer The results are shown in Table 1.

TABLE 1

| | # of detached devices/ # of devices | $K^{2*}$ (%) |
|---|---|---|
| 1st embodiment | 0/10 | 1.6 |
| 1st comparative example | 6/10 | 1.3 |

$K^{2*}$: average 1st order mode electromechanical coupling coefficient

Second Embodiment

Similar to the first embodiment, an Si base substrate having dimensions of 10×10×1 mm was prepared and placed in a plasma CVD apparatus. The reaction chamber of the apparatus was evacuated, and a gas mixture of $H_2$: $CH_4=200:1$ was introduced therein. Plasma CVD was performed under the following conditions: a vacuum chamber pressure of about 40 Torr, a base substrate temperature of 850° C., and a microwave power of 400 W to grow a 30 μm thick diamond thin film (hard layer) on the Si substrate. The diamond thin film was left in the atmosphere of the reaction chamber at 450° C. for 10 minutes to increase the resistivity of the diamond thin film.

Next, similar to the first embodiment, a surface of the diamond thin film was machine polished, and thereafter magnetron-sputtered using as a target a ZnO polycrystalline body including $Ga_2O_3$ ($Al_2O_3$). At this time, sputtering was performed in a mixture gas of Ar: $O_2=1:1$ at a 150 W sputtering output and a 200° C. base substrate temperature. Therefore, a conductive ZnO thin film into which 3.0 atomic % Ga to ZnO was doped was deposited to 500 angstroms thickness. At this time, the resistivity of the deposited conductive ZnO thin film was less than or equal to $1.0\times10^{-3}\Omega cm$.

Further, under the same conditions, magnetron sputtering was applied to the deposited conductive ZnO thin film using a target of polycrystalline ZnO including $Li_2CO_3$. Therefore, an insulating ZnO thin film to which 2.0 atomic % Li to ZnO was doped was deposited to 2.5 μm thickness.

Next, a 500 angstroms thick layer comprising Al was vapor-deposited on the insulating ZnO thin film by a resistance heating method. Next, interdigital transducers (a group of electrodes) having a 2 μm space between each of the electrodes were formed on the Al layer by using a photolithography method. The interdigital transducer shape is similar to that of the first embodiment.

Next, magnetron sputtering was applied to the deposited conductive ZnO thin film using a target of $SiO_2$. At this point, sputtering was performed in an Ar: $O_2=1:1$ mixture gas at a 200 W sputtering output and 150° C. base substrate temperature. Therefore, a noncrystalline SiO₂ thin film having a thickness of 4 μm was deposited on the insulating ZnO thin film.

FIG. 10 is a sectional view showing a surface acoustic wave device based on the second embodiment with a structure as described above.

As shown in FIG. 10, a diamond thin film 2 is formed on an Si base substrate 1 and grounding electrodes 3 comprising conductive ZnO are formed on the diamond thin film 2, and a piezoelectric layer 4 comprising insulating ZnO is formed thereon. Further, interdigital transducers 5 are formed on the piezoelectric layer 4, and a noncrystalline SiO₂ thin film 6 is formed so that it covers the interdigital transducers 5.

Second Comparative Example

In a second comparative example, to be compared with the above surface acoustic wave device of the second embodiment, a comparative surface acoustic wave device was manufactured following the same procedures as described above for the second embodiment, except that 500 angstroms thick grounding electrodes comprising metal Al were formed by a vacuum vapor deposition method.

For to the surface acoustic wave device of the second comparative example, a diamond thin film is formed on an Si base substrate, and grounding electrodes comprising Al are formed on the diamond thin film, and further a piezoelectric layer comprising insulating ZnO is formed thereon. Moreover, interdigital transducers are formed on the piezoelectric layer, and a noncrystalline SiO₂ film is formed so that it covers the interdigital transducers.

Ten surface acoustic wave devices were manufactured for each of the second embodiment and the second comparative example. Immediately after manufacturing, the occurrence of detachment and the first order mode electromechanical coupling coefficient $K^2$ of each sample were evaluated. The evaluating procedure is the same as for the first embodiment. The results are shown in Table 2.

TABLE 2

| | # of detached devices/ # of devices | $K^{2*}$ (%) |
|---|---|---|
| 2nd embodiment | 0/10 | 1.5 |
| 2nd comparative example | 5/10 | 1.1 |

$K^{2*}$: average 1st order mode electromechanical coupling coefficient

Third Embodiment

The surface acoustic wave device having the structure shown in FIG. 11 was manufactured.

As shown in FIG. 11, a diamond thin film 2 is formed on an Si base substrate 1. Interdigital transducers 5 are formed on the diamond thin film 2, and further a piezoelectric layer 4 comprising insulating ZnO is formed thereon so that it covers the interdigital transducers 5. Grounding electrodes 3 comprising conductive ZnO are formed on the piezoelectric layer 4, and further a SiO₂ thin film 6 is formed thereon.

To manufacture the surface acoustic wave device having the structure shown in FIG. 11, the diamond thin film was formed by the plasma CVD under the same conditions as for the first embodiment. The thickness of the diamond thin film was 30 μm. The 0.9 μm thick piezoelectric layer 4 and the interdigital transducers 5 were formed under the same conditions as the first embodiment. Further, the electrically conductive ZnO thin film into which 3.0 atomic % In to ZnO was doped by the sputtering method was formed 500 angstroms in thickness. Moreover, the SiO₂ thin film 6 was formed by the sputtering method under the same conditions as for the second embodiment. The thickness of the SiO₂ thin film 6 was 3 μm.

Third Comparative Example

In a third comparative example, to be compared with the above surface acoustic wave device of the third embodiment, a comparative surface acoustic wave device was manufactured following the same procedures as described above for the third embodiment, except that 500 angstroms thick grounding electrodes comprising metal Al were formed by a vacuum vapor deposition method.

For the surface acoustic wave device of the third comparative example, a diamond thin film is formed on an Si base substrate, and interdigital transducers comprising Al are formed on the diamond thin film. A piezoelectric layer comprising insulating ZnO is formed so that it coves the interdigital transducers. Grounding electrodes comprising Al are formed on the piezoelectric layer, and further a SiO₂ thin film is formed thereon.

Ten surface acoustic wave devices were manufactured for each of the third embodiment and the third comparative example. Immediately after manufacturing, the occurrence of detachment and the first order mode electromechanical coupling coefficient $K^2$ of each sample were evaluated. The evaluating procedure is the same as for the first embodiment. The results are shown in Table 3.

TABLE 3

| | # of detached devices/ # of devices | $K^{2*}$ (%) |
|---|---|---|
| 3rd embodiment | 0/10 | 3.3 |
| 3rd comparative example | 7/10 | 3.1 |

$K^{2*}$: average 1st order mode electromechanical coupling coefficient

It is apparent from Table 1 to Table 3 that the surface acoustic wave devices in which the grounding electrodes were formed of the conductive oxide according to the first to third embodiments of the invention can suppress the occurrence of detachment and obtain a high electromechanical coupling coefficient compared to the surface acoustic wave devices in which the grounding electrodes were formed of metal according to the first to third comparative examples.

The surface acoustic wave device of the present invention is preferably applied especially to communication apparatus such as a car telephone or a cellular phone.

From the invention thus described, it will be apparent that the invention may be varied in many ways. Such variations are not to be regarded as a departure from the spirit and scope of the invention, and all such modifications as would be obvious to one skilled in the art are intended to be included within the scope of the following claims.

What is claimed is:

1. A surface acoustic wave device comprising:
   a hard layer comprising at least one component selected from the group consisting of diamond and diamond-like carbon;
   a piezoelectric layer disposed on said hard layer;
   an interdigital transducer; and
   a grounding electrode comprising a conductive oxide, disposed at a position corresponding to said interdigital transducer;

said interdigital transducer and said grounding electrode being disposed with said piezoelectric layer therebetween, and either said interdigital transducer or said grounding electrode being disposed on said hard layer.

2. The surface acoustic wave device according to claim 1, wherein said hard layer comprises diamond and does not comprise diamond-like carbon.

3. The surface acoustic wave device according to claim 2, wherein said grounding electrode has a resistivity less than or equal to $10^{-2}\Omega cm$.

4. The surface acoustic wave device according to claim 2, wherein said grounding electrode is disposed on said hard layer.

5. The surface acoustic wave device according to claim 3, wherein said piezoelectric layer comprises one or more materials selected from the group consisting of ZnO, AlN, PB(Zr, Ti)O$_3$, (Pb, La)(Zr, Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe and CdS.

6. The surface acoustic wave device according to claim 3, wherein said conductive oxide of said grounding electrode comprises one or more materials selected from the group consisting of SnO$_2$, In$_2$O$_3$, TiO, LiV$_2$O$_4$, ReO$_3$, LaTiO$_3$, SrVO$_3$, CaCrO$_3$, V$_2$O$_3$, VO$_2$, CrO$_2$ and IrO$_2$.

7. The surface acoustic wave device according to claim 1, wherein said hard layer comprises a diamond-like carbon film.

8. The surface acoustic wave device according to claim 7, wherein said grounding electrode has a resistivity less than or equal to $10^{-2}\Omega cm$.

9. The surface acoustic wave device according to claim 7, wherein said grounding electrode is disposed on said hard layer.

10. The surface acoustic wave device according to claim 8, wherein said piezoelectric layer comprises one or more materials selected from the group consisting of ZnO, AlN, PB(Zr, Ti)O$_3$, (Pb, La)(Zr, Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe and CdS.

11. The surface acoustic wave device according to claim 8, wherein said conductive oxide of said grounding electrode comprises one or more materials selected from the group consisting of SnO$_2$, In$_2$O$_3$, TiO, LiV$_2$O$_4$, ReO$_3$, LaTiO$_3$, SrVO$_3$, CaCrO$_3$, V$_2$O$_3$, VO$_2$, CrO$_2$ and IrO$_2$.

12. The surface acoustic wave device of claim 1, wherein said hard layer consists essentially of said diamond.

13. The surface acoustic wave device of claim 1, wherein said grounding electrode consists essentially of said conductive oxide.

14. A surface acoustic wave device comprising:
a hard layer comprising diamond;
a piezoelectric layer disposed on said hard layer;
a layer comprising silicon dioxide disposed on said piezoelectric layer;
an interdigital transducer; and
a grounding electrode comprising a conductive oxide, disposed at a position corresponding to said interdigital transducer;
said interdigital transducer and said grounding electrode being disposed with said piezoelectric layer therebetween, and either said interdigital transducer or said grounding electrode being disposed on said hard layer.

15. The surface acoustic wave device of claim 14, wherein said hard layer consists essentially of said diamond.

16. The surface acoustic wave device of claim 14, wherein said grounding electrode consists essentially of said conductive oxide.

17. A surface acoustic wave device comprising:
a hard layer comprising diamond;
a piezoelectric layer disposed on said hard layer and comprising one or more materials selected from the group consisting of ZnO, AlN, PB(Zr, Ti)O$_3$, (Pb, La)(Zr, Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe and CdS;
an interdigital transducer; and
a grounding electrode having a resistivity less than or equal to $10^{-2}\Omega cm$, comprising a conductive oxide formed by doping an impurity into material constituting said piezoelectric layer, and being disposed at a position corresponding to said interdigital transducer;
said interdigital transducer and said grounding electrode being disposed with said piezoelectric layer therebetween, and either said interdigital transducer or said grounding electrode being disposed on said hard layer.

18. The surface acoustic wave device of claim 17, wherein said hard layer consists essentially of said diamond.

19. The surface acoustic wave device of claim 17, wherein said grounding electrode consists essentially of said conductive oxide.

20. The surface acoustic wave device according to claim 17, wherein said piezoelectric layer comprises ZnO and said grounding electrode is formed by doping an impurity into ZnO.

21. The surface acoustic wave device according to claim 20, wherein said impurity comprises one or more materials selected from the group consisting of Al, V, Ga and In.

22. A surface acoustic wave device comprising:
a hard layer comprising a diamond-like carbon film;
a piezoelectric layer disposed on said hard layer;
an interdigital transducer;
a grounding electrode comprising a conductive oxide, disposed at a position corresponding to said interdigital transducer; and
a layer comprising silicon dioxide;
said interdigital transducer and said grounding electrode being disposed with said piezoelectric layer therebetween, and either said interdigital transducer or said grounding electrode being disposed on said hard layer.

23. The surface acoustic wave device of claim 22, wherein said grounding electrode consists essentially of said conductive oxide.

24. A surface acoustic wave device comprising:
a hard layer comprising a diamond-like carbon film;
a piezoelectric layer disposed on said hard layer and comprising one or more materials selected from the group consisting of ZnO, AlN, PB(Zr, Ti)O$_3$, (Pb, La)(Zr, Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe and CdS;
an interdigital transducer; and
a grounding electrode having a resistivity less than or equal to $10^{-2}\Omega cm$, comprising a conductive oxide formed by doping an impurity into material constituting said piezoelectric layer, and being disposed at a position corresponding to said interdigital transducer;

said interdigital transducer and said grounding electrode being disposed with said piezoelectric layer therebetween, and either said interdigital transducer or said grounding electrode being disposed on said hard layer.

25. The surface acoustic wave device of claim 24, wherein said grounding electrode consists essentially of said conductive oxide.

26. The surface acoustic wave device according to claim 24, wherein said piezoelectric layer comprises ZnO and said grounding electrode is formed by doping an impurity into ZnO.

27. The surface acoustic wave device according to claim 26, wherein said impurity comprises one or more materials selected from the group consisting of Al, V, Ga and In.

* * * * *

UNITED STATES PATENT AND TRADEMARK OFFICE
CERTIFICATE OF CORRECTION

PATENT NO. : 5,426,340
DATED : June 20, 1995
INVENTOR(S) : Kenjiro Higaki et al.

It is certified that error appears in the above-indentified patent and that said Letters Patent is hereby corrected as shown below:

```
Item [56] Under Reference Cited,
On the title page, in Foreign Patent Documents, please replace
"14132309   4/1993  Germany... 310/313/A" by
--4132309   4/1993  Germany... 310/313/A--;
please replace 2nd Column;
"14132920   5/1992  Japan...   310/313 R" by
--4132920   5/1992  Japan...   310/313 R--;
please replace
"15090874   4/1993  Japan...   310/313 A" by
--5090874   4/1993  Japan...   310/313 A--;
Column 2,
        line 66, before "in" insert --placed--;
        line 68, delete "of";
Column 6, line 36, replace "ground" by --grouped--;
Column 7, line 46, after "08/118,976" insert --cross-referenced
                   above--;
Column 7, line 54, delete "and";
          line 67, replace "to" by --into--.
```

Signed and Sealed this

Thirty-first Day of October 1995

Attest:

BRUCE LEHMAN

Attesting Officer

Commissioner of Patents and Trademarks